(12) United States Patent
Wojewoda et al.

(10) Patent No.: US 7,710,303 B2
(45) Date of Patent: May 4, 2010

(54) ANALOG-TO-DIGITAL CONVERTER OFFSET AND GAIN CALIBRATION USING INTERNAL VOLTAGE REFERENCES

(75) Inventors: Igor Wojewoda, Tempe, AZ (US);
Gaurang Kavaiya, Bothell, WA (US);
Tim Phoenix, Pepperell, MA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/051,170

(22) Filed: Mar. 19, 2008

(65) Prior Publication Data
US 2008/0278359 A1 Nov. 13, 2008

Related U.S. Application Data

(60) Provisional application No. 60/912,226, filed on Apr. 17, 2007.

(51) Int. Cl.
*H03M 1/12* (2006.01)
(52) U.S. Cl. .................................. 341/155; 341/110
(58) Field of Classification Search ................. 341/155, 341/156, 120, 118, 110
See application file for complete search history.

(56) References Cited

U.S. PATENT DOCUMENTS

| | | | |
|---|---|---|---|
| 7,429,888 B2 * | 9/2008 | Owen | 327/541 |
| 2005/0248477 A1 * | 11/2005 | Jongsma et al. | 341/110 |

OTHER PUBLICATIONS

Software Adjustment of Gain and Offset Analog Errors, IBM Technical Disclosure Bulletin, IBM Corp. New York, vol. 33, No. 5, Oct. 1, 1990, pp. 165/166, XP000107421.

Lacanette K., Designing 3V and 5V Analogue Circuits in the Mixed Signal World, Electronic Engineering, Morgan-Grampian Ltd., London, GB, vol. 67, No. 819, Mar. 1, 1995, pp. 53/54, 56, 58, 60, XP000507367.

Gurevich M., ADC Gain Calibration Extending the ADC Input Range in MSC12xx Devices, Texas Instruments Application Report, [online] No. SBAA107, Oct. 1, 2003, pp. 1-13, XP007905393, Dallas, Texas, retrieved from the Internet: URL:http://www.gaw.ru/pdf/TI/app/adc/sbaal.

You S-B et al., A CMOS 16-Bit 20MSPS Analog Front End for Scanner/MFP Applications, IEEE Transactions on Consumer Electronics, IEEE Service Center, New York, NY, vol. 49, No. 3, Aug. 1, 2003, pp. 647-652, XP001172110.

International Search Report and Written Opinion for PCT/US2008/060314 mailed Sep. 2, 2008.

* cited by examiner

*Primary Examiner*—Rexford N Barnie
*Assistant Examiner*—Joseph Lauture
(74) *Attorney, Agent, or Firm*—King & Spalding L.L.P.

(57) ABSTRACT

A mixed signal device having an analog-to-digital converter (ADC) with offset and gain calibration using internal voltage references whereby the digital processor calibrates out offset and gain errors in the analog-to-digital converter by adjusting the analog input amplifier gain and offset or with software compensating the digital representations of the voltages measured. Two different known voltage values are used in determining the offset and gain adjustments needed to calibrate the ADC against the two know voltage values. The mixed signal device may further comprise a Bandgap voltage reference having an accurate known voltage value. Wherein the Bandgap voltage reference may be used for further offset and gain calibration of the ADC to produce substantially absolute voltage values.

21 Claims, 6 Drawing Sheets

1111 = Channel 0 positive Input is Bandgap reference (VBG)
1110 = Channel 0 positive Input is Bandgap divided by two reference (VBG/2)
1101 = Avss
1100 = Channel 0 positive Input is AN12
1011 = Channel 0 positive Input is AN11
1010 = Channel 0 positive Input is AN10
1001 = 0.75 VDD
1000 = 0.25 VDD
0110 = AVDD
0110 = AVSS
0101 = Channel 0 positive Input is AN5
0100 = Channel 0 positive Input is AN4
0010 = Channel 0 positive Input is AN3
0010 = Channel 0 positive Input is AN2
0001 = Channel 0 positive Input is AN1
0000 = Channel 0 positive Input is AN0

ANALOG-TO-DIGITAL CONVERTER OFFSET AND GAIN CALIBRATION USING INTERNAL VOLTAGE REFERENCES

RELATED PATENT APPLICATION

This application claims priority to commonly owned U.S. Provisional Patent Application Ser. No. 60/912,226; filed Apr. 17, 2007; entitled "Analog-to-Digital Converter Offset and Gain Calibration Using Internal Voltage References," by Igor Wojewoda, Gaurang Kavaiya and Tim Phoenix; which is hereby incorporated by reference herein for all purposes.

TECHNICAL FIELD

The present disclosure relates to analog-to-digital converters (ADCs), and more particularly to, calibrating the offset and gain of an ADC for absolute value voltage measurements.

BACKGROUND

Present technology analog-to-digital conversion circuits have multiple input channels by using analog multiplexing circuits that allow input selection from several different external analog sources for analog-to-digital conversions thereof. However, since the absolute values of the external analog sources may not be known and have to be verified by accurate measurements, and imperfections in the analog-to-digital conversion circuitry such as offset and gain errors result in inaccurate analog-to-digital conversion measurements of the external analog voltages being measured. The offset and gain errors may result from circuit non-linearity, resistive voltage drop, and/or manufacturing process variations. Also without accurate points of reference and/or an absolute voltage reference to compare to, only relative measurements with respect to power supply voltages, e.g., $V_{DD}$, are possible.

SUMMARY

Therefore a need exists to obtain substantially accurate value voltage measurements by calibrating out offset and gain errors of the analog-to-digital conversion circuits, and to adjust (e.g., calibrate) the resultant voltage values to proportionally accurate voltage values by comparing them to precision scaled voltage references such as $V_{DD}$ and $V_{DD}$ divided by a precision resistance voltage divider. In addition, absolute voltage calibration may be obtained by using a highly accurate and stable absolute voltage reference such as a Bandgap voltage reference and the like.

According to teachings of this disclosure, several analog-to-digital input channels of an ADC, e.g., an analog multiplexer coupled to the sample and hold circuits of the ADC, may be connected to internal voltage references rather then used for coupling to external analog voltage sources to be measured. The internal voltage references may comprise, for example but are not limited to, a Bandgap reference, divided down $V_{DD}$ supply voltage reference that may include, for example but are not limited to, voltage references of approximately ¼ $V_{DD}$ and ¾ $V_{DD}$, etc. Since ADC measurements are relative to $V_{DD}$, converting and calibrating using the ¼ $V_{DD}$ and ¾ $V_{DD}$ voltage values may allow calibrating out substantially all of the linear offset and gain errors of the ADC. Then by further converting the calibrated values obtained from the relative $V_{DD}$ values against an absolute value, e.g., Bandgap reference voltage of 1.2 volts, the ADC measurement conversion values may be translated to absolute voltage measurements. This process results in a quick and reliable way to obtain accurate absolute voltage measurements using the analog-to-digital conversion circuits. It is contemplated and within the scope of this disclosure that full-scale analog $V_{DD}$ and $V_{SS}$ (common) may also be used as internal references in calibrating out offset and gain errors of the analog-to-digital conversion circuits.

The ADC calibration may be derived from the line equation y=mx+c, where y represents the calibrated measured values, x represents the un-calibrated measured input values, m is the gain adjustment and c is the calibration offset required. Once m and c are known, all values of x will result in the correct y values. The m and c values may be stored in registers and a software program may calculate using the m and c values the correct y value for each measured x value, and/or the m and c values may be programmed as hardware gain and offset adjustments to the analog front end of the ADC without the need for software calculations during the ADC conversion process.

According to a specific example embodiment of this disclosure, a mixed signal device having an analog-to-digital converter that is calibrated using internal voltage references comprises: a digital processor; an analog-to-digital converter (ADC); an analog multiplexer; and a voltage divider coupled to a power supply voltage and having a plurality of different voltage values derived from the power supply voltage, wherein: the ADC is coupled to an output of the analog multiplexer and to the digital processor, and at least two of the plurality of different voltage values are coupled to at least two inputs, respectively, of the analog multiplexer; wherein the digital processor calculates gain and offset values required for calibrating the ADC output by using the at least two of the plurality of different voltage values as voltage reference points.

According to another specific example embodiment of this disclosure, a mixed signal device having an analog-to-digital converter that is calibrated using internal voltage references comprises: a digital processor; an analog-to-digital converter (ADC); an analog multiplexer; and a voltage reference having at least two different voltages, wherein: the ADC is coupled to an output of the analog multiplexer and to the digital processor, and the least two different voltages from the voltage reference are coupled to at least two inputs, respectively, of the analog multiplexer; wherein the digital processor calculates gain and an offset values required for calibrating the ADC output by using the at least two different voltages from the voltage reference as voltage reference points.

According to yet another specific example embodiment of this disclosure, a method for calculating gain and offset necessary to calibrate an analog-to-digital converter by using internal reference voltages, said method comprising the steps of: measuring a first reference voltage; storing the measured first reference voltage; measuring a second reference voltage; storing the measured second reference voltage; calculating gain and offset values, using the first and second reference voltages, necessary to calibrate an analog-to-digital converter; and calibrating the analog-to-digital converter by adjusting the gain and offset thereof.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of a specific example embodiment is schematically illustrated. Like elements in the drawings will be represented by like numbers, and similar elements will be represented by like numbers with a different lower case letter suffix.

Figure 1:
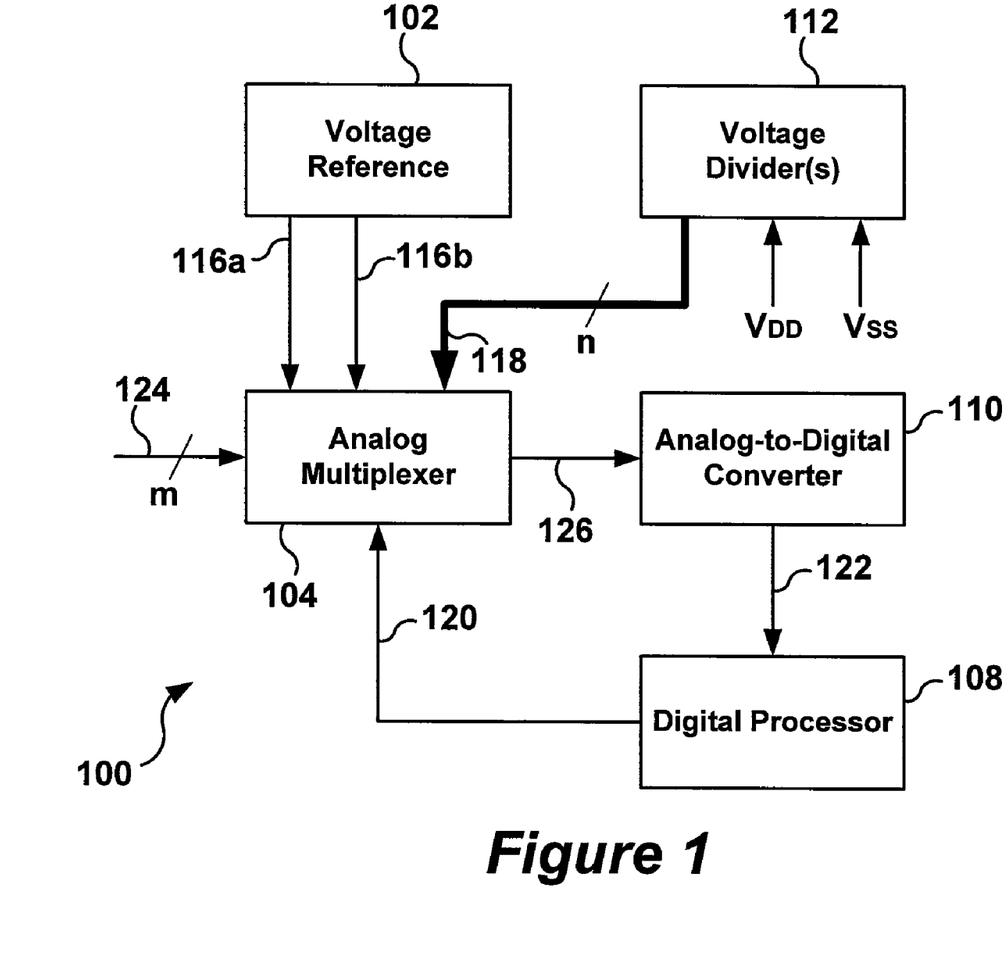
FIG. 1 is a schematic block diagram of a mixed signal device having analog-to-digital conversion capabilities, according to a specific example embodiment of this disclosure.

Referring to FIG. 1, depicted is a schematic block diagram of a mixed signal device having analog-to-digital conversion capabilities, according to a specific example embodiment of this disclosure. The mixed signal device (i.e., having both analog and digital circuits) is generally represented by the numeral 100 and may comprise a digital processor 108, an analog-to-digital converter (ADC) 110, an analog multiplexer 104 and a voltage divider 112. An absolute voltage reference 102, optionally, may be used for absolute voltage calibration of the mixed signal device 100. The digital processor 108, e.g., microprocessor, microcontroller, digital signal process, application specific integrated circuit (ASIC), programmable logic array (PLA), etc., may receive digital representations of analog voltages converted by the circuit for analog-to-digital conversion 110 over a digital data bus 122. The digital processor 108 controls which analog input of the analog multiplexer 104 is selected.

The analog multiplexer 104 may be used for selecting any one of the external analog inputs 124, absolute voltages 116a or 116b, any one of a plurality of different voltage values on an analog voltage bus 118, $V_{DD}$ and/or $V_{SS}$. The digital processor 108 may be used to control the analog multiplexer 104 input-to-output routing of a selected analog voltage at the inputs of the input multiplexer 104 such that the selected analog voltage appears as an output 126 from the analog multiplexer 104 and thereby may be applied to the ADC 110 for conversion to a digital representation thereof on the digital data bus 122.

The absolute voltage reference 102 may be a Bandgap voltage reference and the like. An absolute voltage 116 from the voltage reference 102, e.g., Bandgap voltage reference of 1.20 volts, may be applied to an input of the analog multiplexer 104. The Bandgap voltage reference may also be divided by a voltage divider (not shown), where the absolute reference voltage 116a may be divided into lower value voltage 116b, e.g., 0.6 volts, reference by, for example but not limited to, a precision resistor divider network making up the voltage divider 112. A plurality of different voltage values, n, are available from the voltage divider 112. The plurality of different voltage values may be derived from power supply voltages $V_{DD}$ and $V_{SS}$ and made available on the analog voltage bus 118 to the analog multiplexer 104. $V_{DD}$ and $V_{SS}$ are full-scale power source voltage values that may also be available from the analog voltage bus 118 at respective inputs of the analog multiplexer 104. For example, if the voltage divider 112 has 64 unit resistors, the 16th voltage tap may supply a voltage of $16/64$ or $¼ V_{DD}$, and the 48th voltage tap may supply a voltage of $48/64$ or $¾ V_{DD}$. It is contemplated and within the scope of this disclosure that any two or more voltage taps may be used, however, ¼ and ¾ of full scale $V_{DD}$ will be used throughout specific example embodiments disclosed herein.

The ADC calibration may be derived from the line equation $y=mx+c$, where y represents the calibrated measured values, x represents the un-calibrated measured input values, m is the gain adjustment and c is the calibration offset required. Once m and c are known, all values of x will result in the correct y values. All that is necessary are two calibration points, e.g., ¼ $V_{DD}$ and ¾ $V_{DD}$ or two voltages 116a and 116b from the voltage reference 102, for determining the m and c values. The m and c values may be stored in registers (not shown) of the digital processor 108 and a software program running in the digital processor 102 may calculate, using the m and c values, the correct y value for each measured x value, and/or the m and c values may be programmed as hardware gain and offset adjustments to the analog front end of the ADC 110 without the need for software calculations during the ADC conversion process.

Figure 2:
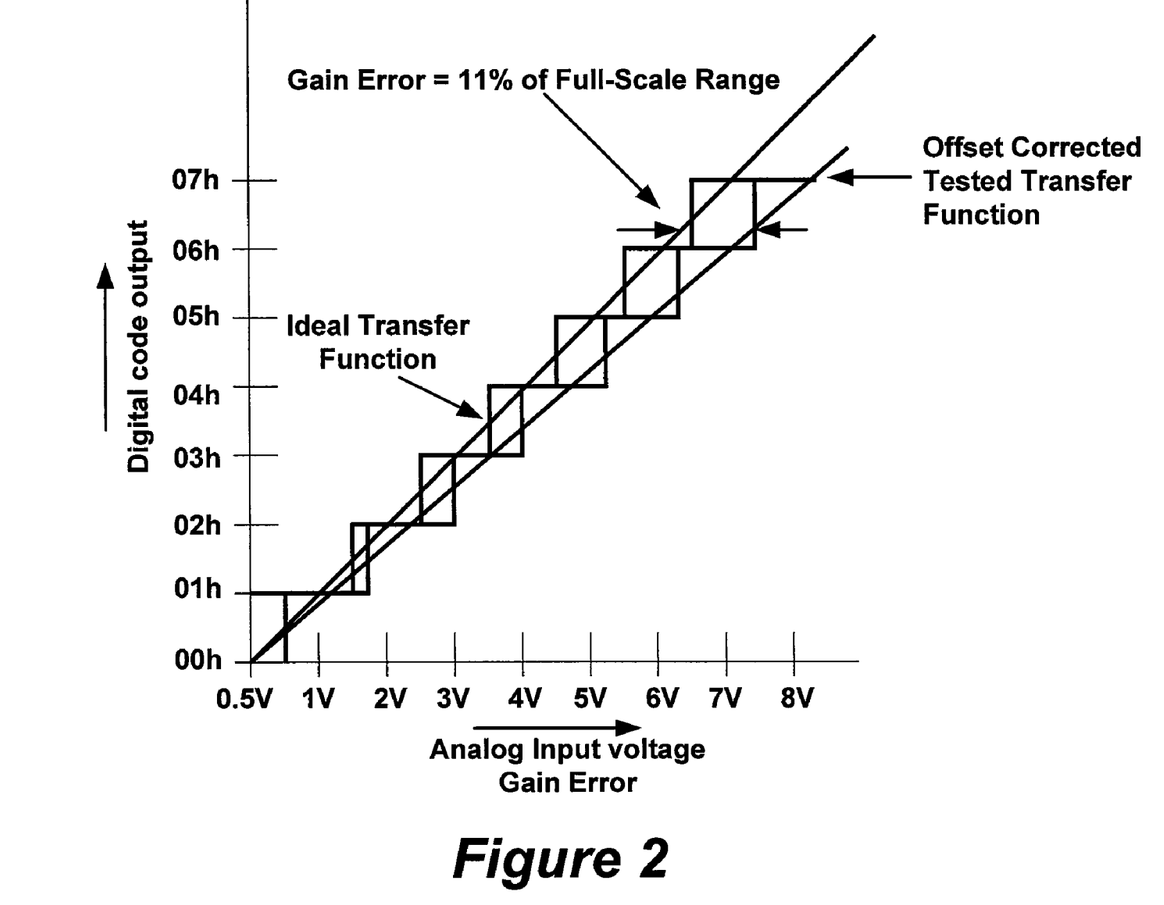
FIG. 2 is a schematic graph of specific example gain errors that may be inherent in the uncompensated circuit for analog-to-digital conversion of the mixed signal device of FIG. 1, according to the specific example embodiment of this disclosure.

Referring to FIG. 2, depicted is a schematic graph of specific example gain errors that may be inherent in the uncompensated circuit for analog-to-digital conversion of the mixed signal device of FIG. 1, according to the specific example embodiment of this disclosure. These gain errors affect the ADC conversion performance.

Figure 3:
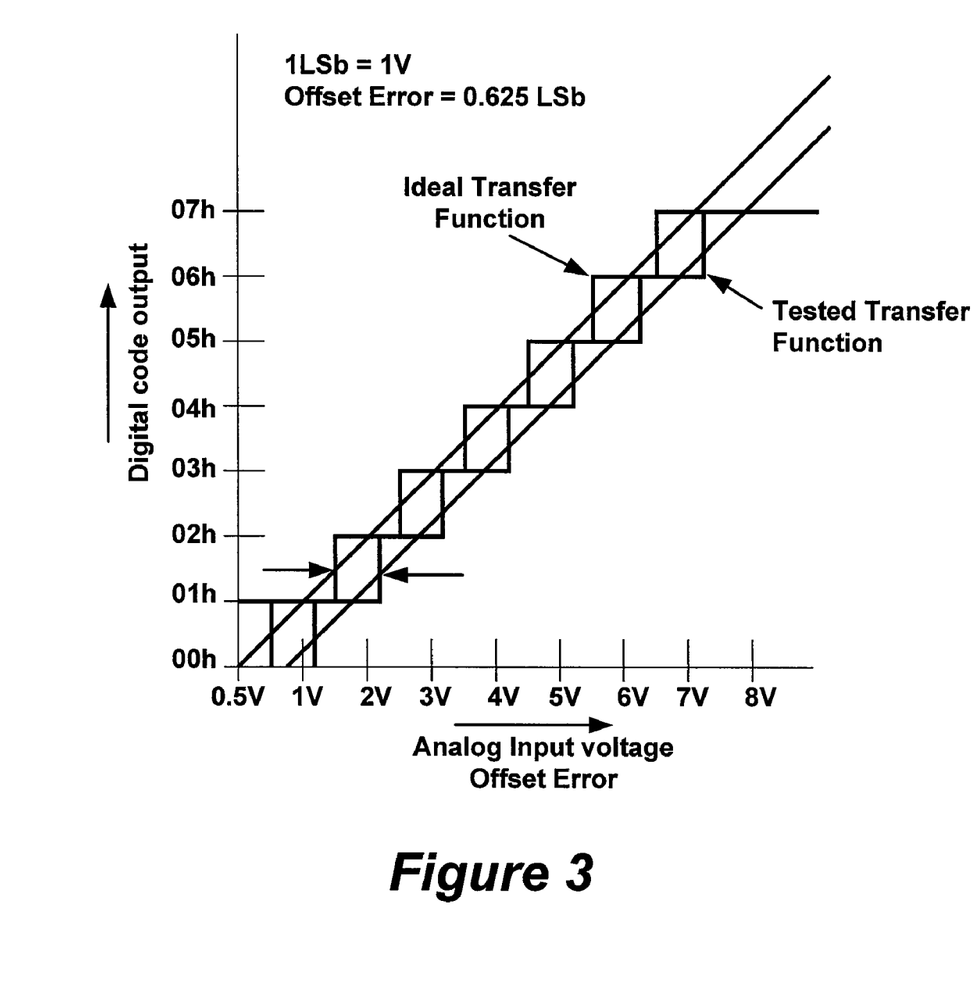
FIG. 3 is a schematic graph of specific example offset errors that may be inherent in the uncompensated circuit for analog-to-digital conversion of the mixed signal device of FIG. 1, according to the specific example embodiment of this disclosure.

Referring to FIG. 3, depicted is a schematic graph of specific example offset errors that may be inherent in the uncompensated circuit for analog-to-digital conversion of the mixed signal device of FIG. 1, according to the specific example embodiment of this disclosure. These offset errors affect the ADC conversion performance.

Figure 4:
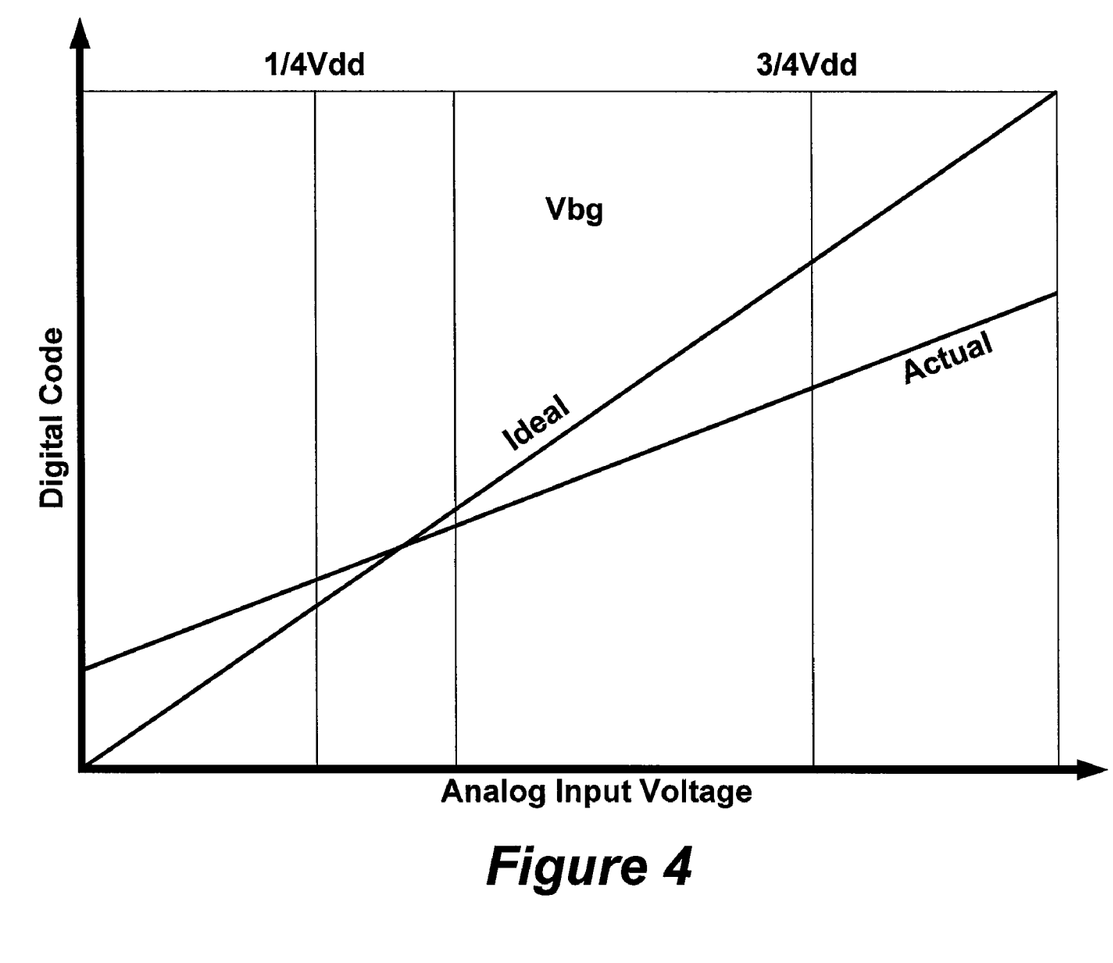
FIG. 4 is a schematic graph of differences between an ideal and an uncompensated analog-to-digital transfer curve of the uncompensated circuit for analog-to-digital conversion of the mixed signal device of FIG. 1, according to the specific example embodiment of this disclosure.

Referring to FIG. 4, depicted is a schematic graph of differences between an ideal and an uncompensated analog-to-digital transfer curve of the uncompensated circuit for analog-to-digital conversion of the mixed signal device of FIG. 1, according to the specific example embodiment of this disclosure. Once measurements are taken at, for example but are not limited to, approximately ¼ $V_{DD}$ and ¾ $V_{DD}$, the actual transfer curve may be adjusted using software in the digital processor 108 to yield a substantially ideal transfer function for much improved conversion accuracy, or the m and c values may be programmed as hardware gain and offset adjustments to the analog front end of the ADC 110 without the need for software calculations during the ADC conversion process. The substantially ideal transfer function may be stored in a memory, such as non-volatile memory, (not shown) associated with the digital processor 108. Once the actual transfer curve has been adjusted to the substantially ideal transfer function, measuring the absolute Bandgap voltage reference value(s), e.g., absolute voltages 116a and/or 116b, will allow translation of the relative ADC measurements to absolute voltage measurements, based upon the substantially ideal transfer function and the Bandgap voltage reference value(s) used.

Figure 5:
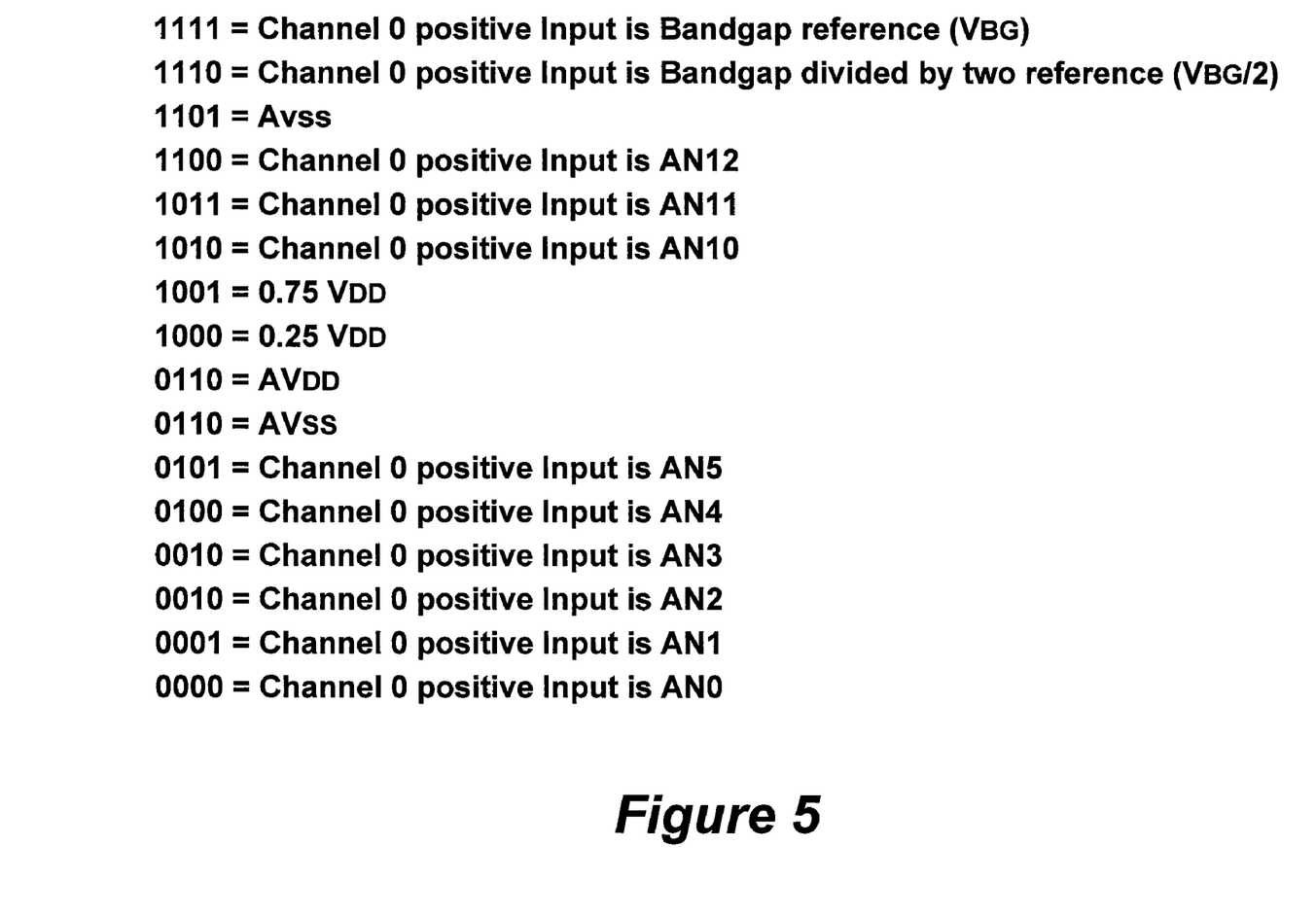
FIG. 5 is a table of ADC input selection bits for determining an analog input of the analog multiplexer for coupling a respective analog voltage to the ADC of the mixed signal device shown in FIG. 1, according to the specific example embodiment of this disclosure.

Referring to FIG. 5, depicted is a table of ADC input selection bits for determining an analog input of the analog multiplexer for coupling a respective analog voltage to the ADC of the mixed signal device shown in FIG. 1, according to the specific example embodiment of this disclosure. For example, when the digital processor 108 applies "1111" to a control input of the analog multiplexer 104, the ADC 110 may convert on the Bandgap voltage. When the digital processor 108 applies "1001" to the control input of the analog multiplexer 104, the ADC 110 may convert on ¾ $V_{DD}$. By selecting bits "1000" to the control input of the analog multiplexer 104, the ADC 110 may convert on ¼ $V_{DD}$. It is contemplated and within the scope of this disclosure that any combination of reduced voltages, depending upon the number of voltage taps on the divider resistor string may be used that approximate ¼ $V_{DD}$ and ¾ $V_{DD}$. The reduced voltage values, e.g., resistor divider taps, may be selected in order to keep the values away from the end ranges, i.e., minimum ($V_{SS}$) and maximum ($V_{DD}$) of the ADC 110, while maximizing the difference between the substantially linear conversion points (e.g., ¼ $V_{DD}$ and ¾ $V_{DD}$) of the ADC 110.

Figure 6:
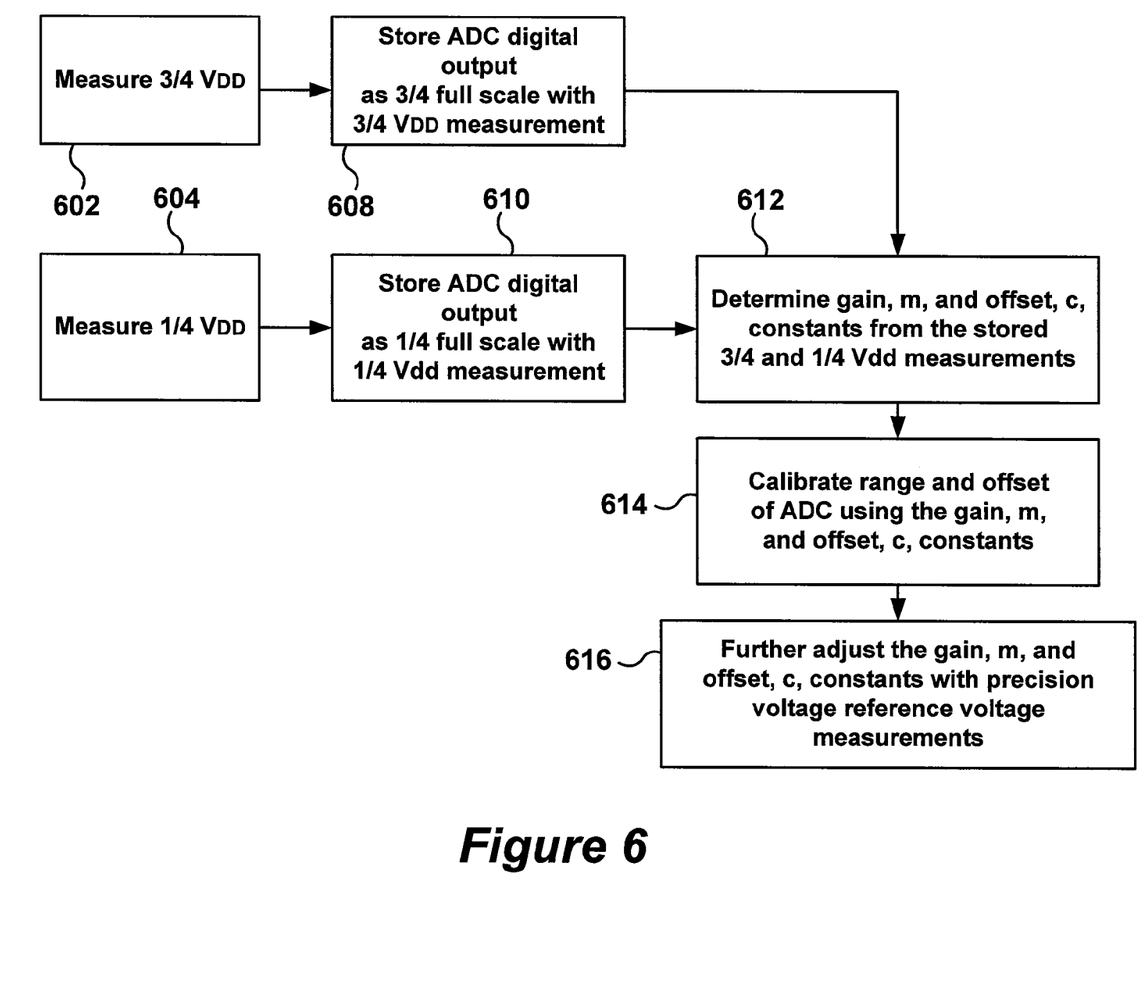
FIG. 6 is a schematic flow diagram of a specific example embodiment of program steps that may be used in correcting values of analog voltages to the analog-to-digital converter of the mixed signal device of FIG. 1, and further calibrating these corrected values to absolute voltage values by using the precision voltage reference shown in FIG. 1.

Referring to FIG. 6, depicted is a schematic flow diagram of a specific example embodiment of program steps that may be used in correcting values of analog voltages to the analog-to-digital converter of the mixed signal device of FIG. 1, and further calibrating these corrected values to absolute voltage values by using the precision voltage reference shown in FIG. 1. Alternatively, two voltage values 116a and 116b from the voltage reference 102 may be used. ¾ $V_{DD}$ is measured in step 602 and is stored in step 608. ¼ $V_{DD}$ is measured in step 604 and is stored in step 610. In step 612, the gain, m, and offset, c, constants are determined from the stored ¾ $V_{DD}$ and ¼ $V_{DD}$ measurements, i.e., y=mx+c as discussed more fully hereinabove. In step 614 the range and offset of the ADC are adjusted to accurately represent the ADC conversions as referenced to $V_{DD}$. Optionally, in step 616 the gain, m, and offset, c, constants are further adjusted to reflect absolute voltage measurements based upon the voltage reference 102, e.g., Bandgap voltage reference. The y=mx+c equation using the calculated gain, m, and offset, c, may be applied to the analog front end of the ADC by adjusting the input analog amplifier gain, M, and offset C as a hardware function, or the y=mx+c equation may be applied to the digital representations from the ADC output using a software program running in the digital processor 108.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A mixed signal device having an analog-to-digital converter that is calibrated using internal voltage references, comprising:
    a digital processor;
    an analog-to-digital converter (ADC);
    an analog multiplexer;
    a voltage divider connected to a power supply voltage and deriving a plurality of different voltage values from the power supply voltage and supplying two of the plurality of different voltages, Y1 and Y2, to two inputs of the analog multiplexer;
    the ADC is connected to an output of the analog multiplexer and to the digital processor, and
    the ADC converts the two of the plurality of different voltage values, Y1 and Y2, to digital voltage values, X1 and X2, respectively, and sends the digital voltage values, X1 and X2, to the digital processor;
    wherein the digital processor calculates gain, m, and offset, c, values required for calibrating the ADC output by using the two of the plurality of different voltage values, Y1 and Y2, as voltage reference points to solve for m and c in equations: Y1=m*X1+c and Y2=m*X2+c.

2. The mixed signal device according to claim 1, further comprising a voltage reference connected to another input of the analog multiplexer, wherein the digital processor further refines the calculation of the gain, m, and offset, c, values required for calibrating the ADC output to an absolute voltage value from the voltage reference.

3. The mixed signal device according to claim 2, wherein the voltage reference is a Bandgap voltage reference and the absolute voltage value is about 1.2 volts.

4. The mixed signal device according to claim 1, wherein the two of the plurality of different voltage values, Y1 and Y2, are approximately one-quarter and three-quarters of the power supply voltage, respectively.

5. The mixed signal device according to claim 1, wherein the ADC output is calibrated by adjusting the ADC analog circuit parameters with the calculated gain, m, and offset, c, values.

6. The mixed signal device according to claim 1, wherein the analog multiplexer couples external voltages to the ADC for conversion to digital values that are read by the digital processor.

7. The mixed signal device according to claim 6, wherein the ADC output is calibrated with al processor by adjusting the digital values from the ADC using the calculated gain, m, and offset, c, values.

8. A mixed signal device having an analog-to-digital converter that is calibrated using internal voltage references, comprising:
    a digital processor;
    an analog-to-digital converter (ADC);
    an analog multiplexer;
    a voltage reference suppling at least two different voltages, Y1 and Y2, to at least two inputs, respectively, of the analog multiplexer;
    the ADC is connected to an output of the analog multiplexer and to the digital processor; and the ADC converts the at least two different voltage values, Y1 and Y2, to digital voltage values, X1 and X2, respectively, and sends the digital voltage values, X1 and X2, to the digital processor;

wherein the digital processor calculates gain, m, and offsets values required for calibrating the ADC output by using the at least two different voltages, Y1 and Y2, from the voltage reference as voltage reference points to solve for m and c in equations: Y1=m*X1+c and Y2=m*X2+c.

9. The mixed signal device according to claim 8, wherein the voltage reference is a Bandgap voltage reference and the at least two different voltages, Y1 and Y2, are about 0.6 volts and about 1.2 volts, respectively.

10. The mixed signal device according to claim 8, wherein the at least two different voltages, Y1 and Y2, from the voltage reference are approximately one-quarter and three-quarters of the voltage reference, respectively.

11. The mixed signal device according to claim 8, wherein the ADC output is calibrated by adjusting the ADC analog circuit parameters with the calculated gain, m, and offset, c, values.

12. The mixed signal device according to claim 8, wherein the analog multiplexer couples external voltages to the ADC for conversion to digital values that are read by the digital processor.

13. The mixed signal device according to claim 12, wherein the ADC output is calibrated with the digital processor by adjusting the digital values from the ADC using the calculated gain, m, and offset, c, values.

14. A method for calculating gain and offset necessary to calibrate an analog-to-digital converter by using internal reference voltages, said method comprising the steps of:

receiving an analog first reference voltage, Y1, at an input of an analog-to-digital converter (ADC);

converting the analog first reference voltage, Y1, to a digital first voltage value, X1, with the ADC;

receiving an analog second reference voltage, Y1, at the input of the ADC;

converting the analog second reference voltage, Y2, to a digital second voltage value, X2, with the ADC;

calculating gain, m, and offset, c, values by solving for m and c in equations: Y1=m*X1+c and Y2=m*X2+c; and calibrating the ADC with the calculated gain, m, and offset, c, values so that the first and second voltage values, X1 and X2, substantially match in values the first and second reference voltages, Y1 and Y2.

15. The method according to claim 14, wherein the first reference voltage, Y1, is about one-quarter of a power supply voltage.

16. The method according to claim 14, wherein the second reference voltage, Y2, is about three-quarters of a power supply voltage.

17. The method according to claim 14, wherein the first and second reference voltages, Y1 and Y2, are from a Bandgap voltage reference.

18. The method according to claim 17, wherein the first reference voltage, Y1, is about 0.6 volts.

19. The method according to claim 17, wherein the second reference voltage, Y2, is about 1.2 volts.

20. The method according to claim 14, wherein the step of calibrating the ADC comprises the steps of adjusting the ADC analog circuit parameters with the calculated gain, m, and offset, c, values.

21. The method according to claim 14, wherein the step of calibrating the ADC comprises the steps of correcting digital values from the ADC using the calculated gain, m, and offset, c, values.

* * * * *

UNITED STATES PATENT AND TRADEMARK OFFICE
CERTIFICATE OF CORRECTION

PATENT NO.        : 7,710,303 B2
APPLICATION NO.   : 12/051170
DATED             : May 4, 2010
INVENTOR(S)       : Igor Wojewoda et al.

It is certified that error appears in the above-identified patent and that said Letters Patent is hereby corrected as shown below:

Column 6, Line 53 of the issued grant needs correction: The word "al" should be deleted and replaced with --the digital--.

Column 6, Line 63 of the issued grant needs correction: The word "suppling" should be deleted and replaced with --supplying--.

Column 7, Line 5 of the issued grant needs correction: The word "offsets" should be deleted and replaced with --offset, c,--.

Signed and Sealed this

Fifth Day of October, 2010

David J. Kappos
*Director of the United States Patent and Trademark Office*